(12) United States Patent
Ward et al.

(10) Patent No.: US 9,024,327 B2
(45) Date of Patent: May 5, 2015

(54) METALLIZATION STRUCTURE FOR HIGH POWER MICROELECTRONIC DEVICES

(75) Inventors: Allan Ward, Durham, NC (US); Jason Henning, Carrboro, NC (US)

(73) Assignee: Cree, Inc., Durham, NC (US)

( * ) Notice: Subject to any disclaimer, the term of this patent is extended or adjusted under 35 U.S.C. 154(b) by 1029 days.

(21) Appl. No.: 11/956,366

(22) Filed: Dec. 14, 2007

(65) Prior Publication Data

US 2013/0134433 A1 May 30, 2013

(51) Int. Cl.
*H01L 29/16* (2006.01)
*H01L 23/482* (2006.01)
(Continued)

(52) U.S. Cl.
CPC ......... *H01L 29/1608* (2013.01); *H01L 23/3171* (2013.01); *H01L 23/4827* (2013.01); *H01L 24/05* (2013.01); *H01L 29/2003* (2013.01); *H01L 29/24* (2013.01); *H01L 29/267* (2013.01); *H01L 29/41766* (2013.01); *H01L 29/475* (2013.01); *H01L 29/7783* (2013.01); *H01L 29/8128* (2013.01); *H01L 2224/04026* (2013.01); *H01L 2924/01013* (2013.01); *H01L 2924/01014* (2013.01); *H01L 2924/01022* (2013.01); *H01L 2924/01033* (2013.01); *H01L 2924/01042* (2013.01); *H01L 2924/01074* (2013.01); *H01L 2924/01078* (2013.01);
(Continued)

(58) Field of Classification Search
CPC ............ H01L 29/1608; H01L 29/7783; H01L 29/475; H01L 24/05; H01L 29/24; H01L 29/8128; H01L 23/4827; H01L 29/2003
USPC ............ 257/194, 192, 201, E29.246–E29.25, 257/E29.252, E29.253, E21.403, E21.407, 257/E21.409; 438/167, 172, 197
See application file for complete search history.

(56) References Cited

U.S. PATENT DOCUMENTS

| 4,811,166 A | 3/1989 | Alvarez et al. |
| 5,140,332 A | 8/1992 | Martin et al. |

(Continued)

FOREIGN PATENT DOCUMENTS

| DE | 10 2004 036142 A1 | 3/2006 |
| DE | 112004036142 A1 | 3/2006 |

(Continued)

OTHER PUBLICATIONS

Partial European Search Report of foreign counterpart application EP08171317; completed Jul. 22, 2009; 2 pgs.

(Continued)

*Primary Examiner* — Ermias Woldegeorgis
(74) *Attorney, Agent, or Firm* — Withrow & Terranova, P.L.L.C.

(57) ABSTRACT

A semiconductor device structure is disclosed that includes a wide-bandgap semiconductor portion selected from the group consisting of silicon carbide and the Group III nitrides. An interconnect structure is made to the semiconductor portion, and the interconnect structure includes at least two diffusion barrier layers alternating with two respective high electrical conductivity layers. The diffusion barrier layers have a coefficient of thermal expansion different from and lower than the coefficient of thermal expansion of the high electrical conductivity layers. The difference in the respective coefficients of thermal expansions are large enough to constrain the expansion of the high conductivity layers but less than a difference that would create a strain between adjacent layers that would exceed the bond strength between the layers.

24 Claims, 3 Drawing Sheets

(51) Int. Cl.
   *H01L 23/00*     (2006.01)
   *H01L 29/20*     (2006.01)
   *H01L 29/24*     (2006.01)
   *H01L 29/47*     (2006.01)
   *H01L 29/778*    (2006.01)
   *H01L 29/812*    (2006.01)
   *H01L 23/31*     (2006.01)
   *H01L 29/267*    (2006.01)
   *H01L 29/417*    (2006.01)

(52) U.S. Cl.
   CPC ........... *H01L 2924/01079* (2013.01); *H01L 2924/01082* (2013.01); *H01L 2924/10272* (2013.01); *H01L 2924/10329* (2013.01); *H01L 2924/1033* (2013.01); *H01L 2924/13091* (2013.01); *H01L 2924/14* (2013.01); *H01L 2924/1423* (2013.01); *H01L 2924/19041* (2013.01); *H01L 2224/05* (2013.01); *H01L 2924/13063* (2013.01); *H01L 2924/01006* (2013.01); *H01L 2924/01019* (2013.01); *H01L 2924/01024* (2013.01); *H01L 2924/01047* (2013.01); *H01L 2924/13064* (2013.01); *H01L 2924/1306* (2013.01)

(56) References Cited

U.S. PATENT DOCUMENTS

| | | | |
|---|---|---|---|
| 5,156,994 | A | 10/1992 | Moslehi |
| 5,286,676 | A * | 2/1994 | Kruger et al. ............ 438/653 |
| 5,408,141 | A | 4/1995 | Devore et al. |
| 5,412,239 | A | 5/1995 | Williams |
| 5,518,805 | A * | 5/1996 | Ho et al. .............. 428/213 |
| 5,567,987 | A | 10/1996 | Lee |
| 5,766,837 | A | 6/1998 | Ozeki et al. |
| 5,972,801 | A | 10/1999 | Lipkin et al. |
| 6,246,076 | B1 | 6/2001 | Lipkin et al. |
| 6,339,020 | B1 * | 1/2002 | Weihs et al. .......... 438/643 |
| 6,507,051 | B1 | 1/2003 | Hara |
| 6,512,275 | B1 | 1/2003 | Hsu et al. |
| 6,686,616 | B1 | 2/2004 | Allen et al. |
| 6,998,322 | B2 | 2/2006 | Das et al. |
| 7,122,466 | B2 | 10/2006 | Park et al. |
| 7,221,002 | B2 | 5/2007 | Okazaki et al. |
| 7,230,284 | B2 | 6/2007 | Parikh et al. |
| 2002/0066908 | A1* | 6/2002 | Smith ................ 257/194 |
| 2002/0179932 | A1* | 12/2002 | Shibata et al. ........... 257/194 |
| 2003/0020092 | A1* | 1/2003 | Parikh et al. ........... 257/192 |
| 2003/0075719 | A1* | 4/2003 | Sriram ................. 257/77 |

FOREIGN PATENT DOCUMENTS

| | | |
|---|---|---|
| EP | 1517380 A2 | 3/2005 |
| EP | 1 744 374 | 1/2007 |
| JP | 63043349 A | 2/1988 |
| JP | 63155743 A | 6/1988 |
| JP | 03222333 A | 10/1991 |
| JP | 2002111061 | 4/2002 |
| JP | 2004311678 A | 11/2004 |
| JP | 2005243730 A | 9/2005 |
| JP | 2008141094 A | 6/2008 |

OTHER PUBLICATIONS

Y. Kitaura et al, "Long-term reliability of Pt and Mo diffusion barriers in Ti-Pt-Au and Ti-Mo-Au metallization systems for GaAs digital integrated circuits," J. Vac. Sc. Technol. B 12(5), Sep./Oct. 1994, pp. 2985-2991.

Office Action for Japanese Application No. 2008-316298 issued Dec. 12, 2011, 12 pages.

English translation of Japanese Office Action for patent application 2008-316298 mailed Apr. 9, 2012, 6 pages.

Examination Report for European Patent application No. 08171317.4, mailed Jun. 12, 2013, 5 pages.

Non-Final Office Action for Japanese Patent Application No. 2008-316298, mailed Aug. 13, 2013, 9 pages.

Office Action for Japanese Patent Application No. 2012-177480, mailed Dec. 24, 2013, 7 pages.

Office Action for Japanese Patent Application No. 2008-316298, mailed Feb. 4, 2014, 27 pages.

Trial Decision of Grant for Japanese Patent Application No. 2008-316298, mailed Sep. 30, 2014, 4 pages.

* cited by examiner

METALLIZATION STRUCTURE FOR HIGH POWER MICROELECTRONIC DEVICES

STATEMENT OF GOVERNMENT INTEREST

The present invention was developed at least in part under Air Force contract number 05-2-5507. The Government may have certain rights in this invention.

BACKGROUND

The present invention relates to interconnect metal structures for semiconductor devices with three or more terminals that operate at relatively high power. Examples include metal semiconductor field effect transistors (MESFETs) formed in silicon carbide (SiC), high electron mobility transistors (HEMTs) formed in the Group III nitride material system and other such devices that operate at a nominal power dissipation of one watt per millimeter (1 W/mm) of gate periphery (or greater) or that experience thermal excursions of more than 150° C. under nominal operating conditions.

As generally well recognized in the semiconductor art, the performance characteristics and capabilities (or limitations) of a semiconductor device are based upon the characteristics of the semiconductor material. Although silicon and gallium arsenide (GaAs) are used for a wide range of semiconductor electronic devices, certain of their performance capabilities will be limited by their bandgap (e.g., 1.12 electron volts (eV) at 300 K for Si and 1.42 eV for GaAs) and by their physical properties (e.g., melting point). Accordingly, for higher power devices, wide bandgap materials such as silicon carbide, the Group III nitrides, and diamond are becoming preferred.

From an electronic standpoint, silicon carbide has a number of theoretical and practical advantages that make its use desirable in microelectronic devices. Silicon carbide has a wide bandgap (3.0 eV for alpha-SiC at 300 K), a high critical breakdown field (approximately 2 mega-volts per centimeter), and a high thermal conductivity (about five watts per centimeter-Kelvin). Silicon carbide is also physically very hard. Silicon carbide has a high electron drift velocity, excellent thermal stability, and excellent radiation resistance or "hardness." These advantages have been recognized and described thoroughly in the patent and non-patent literature The Group III nitride material system offers similar advantages, including wide bandgaps (e.g., 3.36 eV at 300 K for gallium nitride and 6.2 eV for AlN). Additionally, the Group III nitrides form several binary, ternary, and tertiary compounds with bandgaps between 3.4 and 6.2 eV based upon the specific atomic fractions. As a result, they provide the capability to form heterojunctions and related structures between Group III nitride materials. The GaN/AlGaN heterostructure is particularly useful for high electron mobility transistors (HEMTs).

Because such devices are most typically used in combination and in circuits, they are typically connected to other devices using some form of conductive pathways ("interconnects"). These interconnects (often formed of metals) within, between, and among semiconductor devices must be able to withstand the operating parameters—most typically current, power and heat (temperature)—desired or needed from such devices.

As one example among many that are possible, wide bandgap devices such as metal semiconductor field effect transistors and high electron mobility transistors are useful as MMIC (microwave integrated circuits) components that can produce increased power output at traditional radar frequencies (e.g., 16.7 Gigahertz for Ku-band radar) including long pulse radar systems. In such systems, however, metal interconnect systems have been observed to begin to fail as the power density increases. The problems also arise relatively quickly, particularly compared to the otherwise long life advantages of semiconductor electronics. For example, such MESFETs and HEMTs operating at between about 8 and 10 watts per millimeter (gate periphery) have been observed to fail as early as 10 million cycles. Because the devices cycle at about one millisecond per cycle, they will fail in a few hours.

In other applications such devices never need to operate at such power levels. Nevertheless, the failure of high power devices in a relatively short time frame indicates that the same problem will eventually occur in lower power devices and in a similarly unacceptably short period of time.

One aspect of the problem arises from the use of several metals to form an interconnect. Conventional systems will use, for example, a layer of a diffusion barrier metal such as molybdenum adjacent to the semiconductor. A layer of a more electrically conductive material such as gold, silver or aluminum is then layered onto the diffusion barrier metal. These conductive metals can, however, migrate between and among layers of adjacent material. This in turn causes problems such as undesired metallurgical reactions, voids, uneven interfaces and corrosion. As the name implies, the diffusion barrier metal prevents the high electrical conductivity metal from reacting with the semiconductor in an undesired fashion.

Additionally, sometimes the molybdenum layer or an alternative metal such as titanium will be included as an adhesion layer to help maintain the ohmic contact or interconnect in or to the device.

Because high power devices generate relatively high temperatures and high thermal cycles (for example, ranging over 150° C.) the thermal effects on these metals (and any other materials) must be taken into consideration. As a result, and because wider bandgap materials can operate at higher power than lower bandgap materials (for devices of otherwise similar size and structure), the thermal stresses on interconnect metals are greater in wide bandgap material devices than they are in silicon-based or gallium arsenide-based devices.

Expansion is, of course, one such thermal effect. The extent to which the material will expand depends upon the applied temperature and the coefficient of thermal expansion. As well understood in the art, the coefficient of linear thermal expansion is the ratio of the change in length per degree K to the length at 273K. When considering expansion in three dimensions, the coefficient of volume expansion is typically about three times the linear coefficient. Furthermore, the value of the coefficient is temperature dependent.

In general, semiconductor materials have relatively low coefficients of thermal expansion. Metals have higher coefficient of thermal expansion than semiconductors. Within metals, higher electrical conductivity metals tend to have significantly higher coefficient of thermal expansion than do materials of lower electrical conductivity. Diffusion barrier properties tend to be associated with lower coefficients of thermal expansion.

In order to produce ohmic character, adhesion, a diffusion barrier, and conductivity, a metal interconnect system on a semiconductor will often include a layer for each purpose; e.g., one layer for the ohmic contact, a second layer of a different material for adhesion, a third layer of yet another material to act as the diffusion barrier, and the fourth layer of another material to provide high conductivity. As a result, the interconnect will generally consist of three or four different materials with a relatively wide range of coefficients of thermal expansion. Thus, as a high-power wide bandgap device cycles over a given temperature range, the thermal expansion stress tends to cause the layers to delaminate from one another. In particular, the thermal effects create a shear stress (sideways) between layers as well as a principal (Z-direction) stress across the layers. In turn, the stress and other potential factors can lead to resistance increases, film delamination, passivation cracking, and catastrophic device failure.

Because improved devices are reaching power levels never previously seen in devices of equivalent size and structure made from conventional materials, the resulting delamination problems have not been observed. Thus, to some extent, these new problems are a result of success in the design and fabrication of higher power devices in wide bandgap materials.

Of course, the theoretical power capabilities of a device become insignificant if in actual use the associated materials such as metal interconnects tend to fail at a relatively early stage.

Accordingly, a need exists for metal interconnect systems that can withstand the thermal stresses generated by these higher performance devices.

SUMMARY

In one aspect, the invention is a semiconductor device structure that includes a wide-bandgap semiconductor portion selected from the group consisting of silicon carbide and the Group III nitrides. An interconnect structure is made to the semiconductor portion, with the interconnect structure including at least two diffusion barrier layers alternating with two respective high electrical conductivity layers. The diffusion barrier layers have a coefficient of thermal expansion different from and lower than the coefficient of thermal expansion of the high electrical conductivity layers. The difference in the respective coefficients of thermal expansions is large enough to constrain the expansion of the high conductivity layers but less than a difference that would create a strain between adjacent layers that would exceed the bond strength between the layers.

In another aspect, the invention is a wide bandgap insulated gate field effect transistor (IGFET). In this aspect, the invention includes a first semiconductor portion selected from the group consisting of silicon carbide and the Group III nitrides, and having a first conductivity type (p or n). Respective source and drain portions are in the first semiconductor portion and have the opposite conductivity type from the first semiconductor portion. A gate insulator is on the first semiconductor portion between the source and drain portions and a gate contact is on the gate insulator. An interconnect structure is on at least one of the source, the gate contact, and the drain. The interconnect structure includes at least two diffusion barrier layers alternating with two respective high electrical conductivity layers. The diffusion barrier layers have a coefficient of thermal expansion different from and lower than the coefficient of thermal expansion of the high electrical conductivity layers, and the difference in the respective coefficients of thermal expansions are large enough to constrain the expansion of the high conductivity layers but less than a difference that would create a strain between adjacent layers that would exceed the bond strength between the layers.

In yet another aspect, the invention is a high electron mobility transistor that includes a layer of gallium nitride and a layer of aluminum gallium nitride on the gallium nitride layer and forming a heterojunction between the gallium nitride layer and the aluminum gallium nitride layer. Respective source and drain contacts are on the gallium nitride layer and a gate contact is on the aluminum gallium nitride layer. The transistor includes a metal interconnect structure to at least one of the source contact, the drain contact, and the gate contact. The interconnect structure includes at least two diffusion barrier layers alternating with two respective high electrical conductivity layers. The diffusion barrier layers have a coefficient of thermal expansion different from and lower than the coefficient of thermal expansion of the high electrical conductivity layers, and the difference in the respective coefficients of thermal expansions are large enough to constrain the expansion of the high conductivity layers but less than a difference that would create a strain between adjacent layers that would exceed the bond strength between the layers.

The foregoing and other objects and advantages of the invention and the manner in which the same are accomplished will become clearer based on the followed detailed description taken in conjunction with the accompanying drawings.

DETAILED DESCRIPTION

Figure 1:
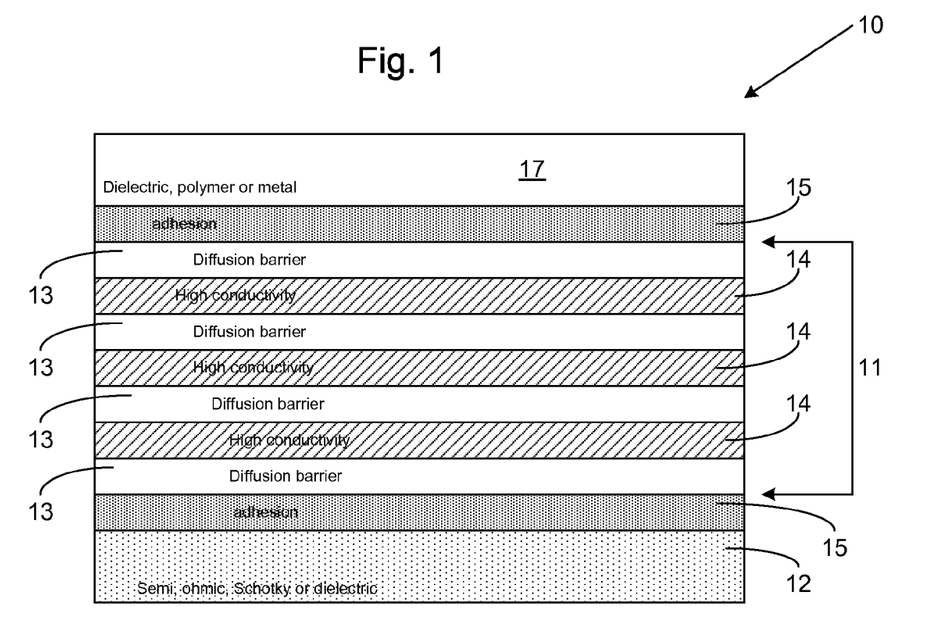
FIG. 1 is a cross-sectional schematic diagram of a metal interconnect system according to the present invention.

FIG. 1 is a cross-sectional schematic diagram of a semiconductor device structure according to the present invention broadly designated at 10. In particular, the bracketed portion 11 represents the basic, although not exclusive, structure of the invention. In a broadest context, the device structure will include a wide bandgap semiconductor portion 12 selected from the group consisting of silicon carbide and the Group III nitrides. In the schematic diagram of FIG. 1, the basic interconnect structure 11 is made to the semiconductor portion 12. In other contexts, the interconnect structure 11 can be made to an ohmic contact, a Schottky contact or to a dielectric material. FIG. 1 also illustrates that the interconnect structure 11 can be covered by or otherwise underneath other structural elements (e.g., dielectrics, polymers, metals) schematically illustrated by the layer 17.

The interconnect structure 11 includes at least two diffusion barrier layers 13 (four are illustrated in FIG. 1) alternating with at least two respective high conductivity layers 14 (three are shown in FIG. 1). The diffusion barrier layers 13 have a coefficient of thermal expansion that is different from and lower than the coefficient of thermal expansion of the high electrical conductivity layers 14. The difference in the respective coefficients of thermal expansion is large enough to constrain the expansion of the high conductivity layers 14 but less than a difference that would create a strain between adjacent layers that would exceed the bond strength between the layers.

FIG. 1 also illustrates that in many embodiments an adhesion layer 15 is used adjacent to one or more of the diffusion barrier layers 13. An adhesion layer is selected for its more reactive properties which provide it with the capability to join, and remain attached to, adjacent layers.

The diffusion barrier layers 13 are selected from materials (including alloys) having lower coefficient of thermal expansion, but better diffusion barrier properties. As known to those in the semiconductor arts, several high-conductivity metals are also reactive with, or migrate readily within, certain semiconductor materials and thus can react with or migrate into semiconductor layers and undesirably modify the operating characteristics of a device. In exemplary embodiments, the diffusion barrier layers 13 are selected from metals and alloys such as platinum, tungsten and titanium tungsten (TiW).

With the diffusion barrier layers 13 in place, the high electrical conductivity layers 14 can be selected for their conductivity properties with gold and aluminum being exemplary. As noted above, the adhesion layers 15 are selected for their properly reactive properties and exemplary choices are titanium and chrome. In each case, the layers serving the respective purpose can be the same or different from one another; e.g., all of the diffusion barrier layers can be formed of the same material. Alternatively, different materials can be used for any one or more of the diffusion barrier layers, provided that the film geometry is such that residual and thermo-mechanical strain of the composite structure is sufficiently low, so as to maintain the integrity of the structure in the desired application. The same possibility applies to the high electrical conductivity layers and the adhesion layers.

Table 1 lists several representative metals and their coefficient of thermal expansion (CTE) expressed in units of 106 K−1

TABLE 1

| Metal | CTE |
| --- | --- |
| Al | 23 |
| Au | 14 |
| Pt | 9 |
| Ti | 8.6 |
| Mo | 4.8 |
| W | 4.5 |

Other materials can be selected for these different layers provided that they have the capability to serve the intended function and do not adversely affect the other layers, or the underlying semiconductor device. If selected on the basis of coefficient of thermal expansion, the high electrical conductivity layer should have a coefficient of thermal expansion that is greater than the coefficient of thermal expansion of the diffusion barrier layer 13 by a factor (multiplication) of between about 1.5 and 2. Stated differently, the coefficient of thermal expansion of the high electrical conductivity layers should be between about one and a half and double the coefficient of thermal expansion of the diffusion barrier layers.

The alternating diffusion barrier layers 13 and high conductivity layers 14, taken with or without the adhesion layers 15 will typically have a thickness of between about 0.1 and 10 microns (μm). With respect to thickness, the invention provides the opportunity to use multiple thinner layers to achieve the same (and in most cases better) performance as the conventional two or three layer (adhesion/diffusion barrier/conductivity) structure. Using a plurality of thin layers reduces the stress between layers because thermo-mechanical strain parallel to the layers is effectively reduced as the total interfacial area between layers of the constraining material and more expansive material is increased. Furthermore, volume expansion in the direction normal to the layers is decreased due to the greater influence of the constraining stress field in the middle of the more expansive layer, because it is in closer proximity to the less expansive layer as the thickness of the more expansive layer is reduced.

The invention can accordingly be used in various proportions and is not limited to particular absolute sizes. It has been observed that a diffusion barrier works best when its thickness is about five times the average grain size. The manner in which the films are deposited can help define the grain structure and thus the grain structure can define different diffusion barrier layer properties.

An adhesion layer 15 will typically have a thickness about the same as the diffusion barrier; i.e., a sufficient amount to join the respective desired layers, with no need for any thickness beyond that. The thickness of the high conductivity layers 14 can be based upon the expected current.

In an exemplary embodiment when the semiconductor portion 12 is silicon carbide, the diffusion barrier layers 13 are platinum, the high conductivity layers 14 are gold, and the adhesion layers 15 are titanium.

In an exemplary, but not limiting, embodiment the structure of FIG. 1 will include a titanium (Ti) adhesion layer 15 about 200 nanometers thick. The diffusion barrier layers 13 will be about 50 nanometers thick and will be formed of platinum (Pt), tungsten (W), molybdenum Mo), and conductive alloys or nitrides of these materials. (If not conductive, the nitrides will create an undesired capacitor structure). The high conductivity layers are typically formed of about 1.5 microns of gold (Au).

The term device is used broadly herein and it will be understood that it can be any appropriate device with examples being junction diodes, insulated gate field effect transistors (IGFETs), metal semiconductor field effect transistors (MESFETs), and high electron mobility transistors (HEMTs).

The basic structure and operation of such devices is generally well understood in the art. Exemplary references include Sze, PHYSICS OF SEMICONDUCTOR DEVICES, Second Edition (1981) John Wiley & Sons, Inc.; Sze, MODERN SEMICONDUCTOR DEVICE PHYSICS (1998) John Wiley & Sons, Inc.; and ZETTERLING, PROCESS TECHNOLOGY FOR SILICON CARBIDE DEVICES, Electronic Materials Information Service (2002).

Figure 2:
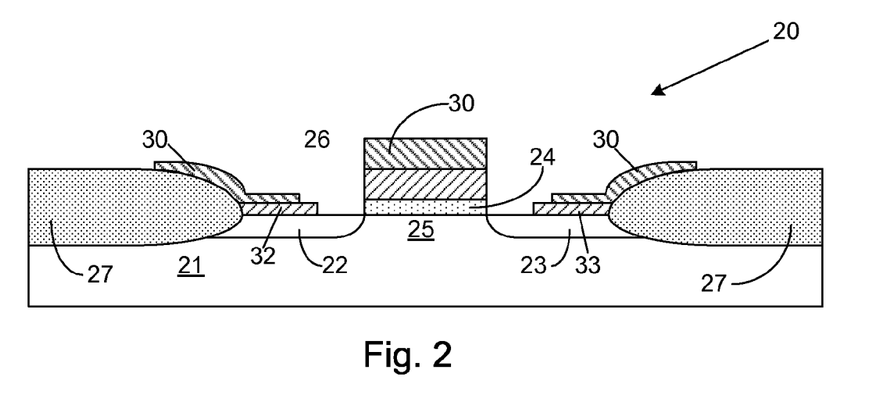
FIG. 2 is a cross-sectional schematic diagram of a metal interconnect system according to the invention in the context of an insulated gate field effect transistor.

FIG. 2 illustrates the invention in the context of an insulated gate field effect transistor (IGFET) broadly designated at 20. The transistor 20 includes a first semiconductor portion 21 selected from the group consisting of silicon carbide and the Group III nitrides. The semiconductor portion 21 has a first conductivity type (p or n).

Respective source 22 and drain portions 23 are in the first semiconductor portion 21 and have the opposite conductivity type from the first semiconductor portion 21. A gate insulator 24 is on the first semiconductor portion 21 between the source 22 and drain portions 23 and defines the channel 25. When an oxide, typically silicon dioxide, is used as the gate insulator, the transistor is generally referred to as a metal oxide semiconductor field effect transistor (MOSFET).

A gate contact 26 typically formed of metal or a conductive material such as polysilicon is on the gate insulator for applying voltage to the gate and controlling the current between the source 22 and drain 23 in a well understood manner. In many circumstances, the transistor 20 is isolated from neighboring devices by portions of a field oxide 27.

An interconnect structure 30 as described with respect to FIG. 1 is made to at least one of the source 22 the gate contact 26 or the drain 23. FIG. 2 illustrates the interconnect structure 30 on each of these items. As in the description of FIG. 1, the interconnect structure will include at least two diffusion barrier layers alternating with two respective high electrical conductivity layers. The diffusion barrier layers have a coefficient of thermal expansion different from and lower than the coefficient of thermal expansion of the high electrical conductivity layers with the difference between the coefficient of thermal expansion being large enough to constrain the expansion of the diffusion barrier layers, but less the difference that would create a strain between adjacent layers that would exceed the bond strength between the layers. In many circumstances, one or more adhesion layers (15 in FIG. 1) will also be present.

As also illustrated in FIG. 2, the transistor 20 will typically include ohmic contacts 32 to the source 22 and 33 to the drain 23 and the interconnect structure will be on the ohmic contact 32 or 33.

When the semiconductor portions 21 comprise silicon carbide, the diffusion barrier layers will typically comprise tungsten, TiW or nickel, and the high conductivity layers will comprise gold or aluminum.

Figure 3:
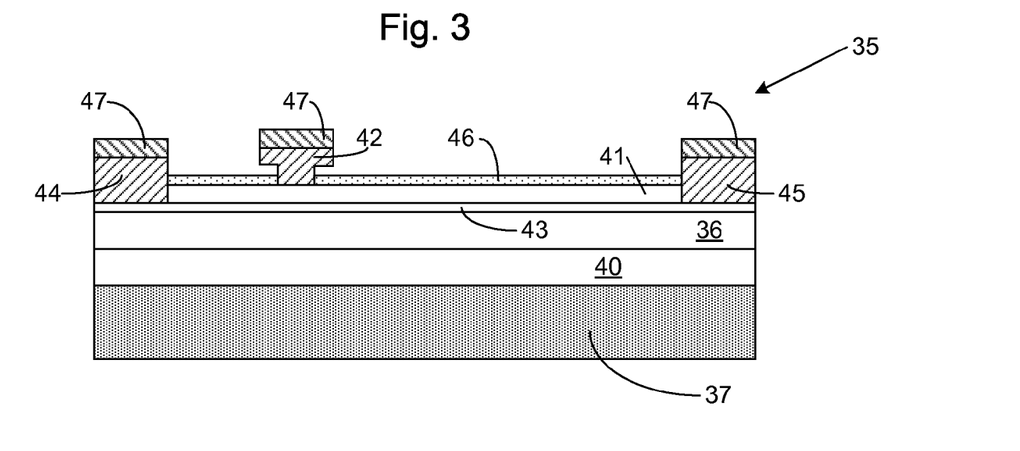
FIGS. 3 and 4 are respective cross-sectional and perspective schematic diagrams of a high electron mobility transistor that incorporates the interconnect system according to the present invention.
Figure 4:
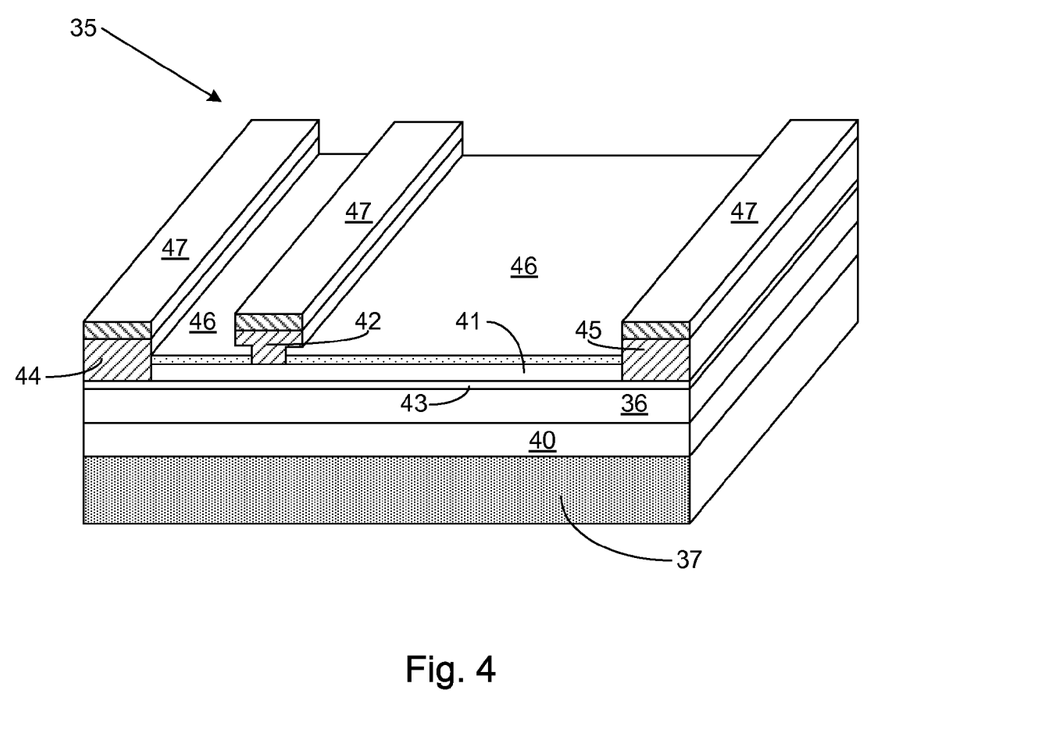

FIGS. 3 and 4 illustrate a high electron mobility transistor (HEMT) broadly designated at 35 that incorporates the interconnect structure according to the present invention. The structure illustrated in FIG. 3 is analogous to the structure set forth in commonly assigned U.S. Pat. No. 7,230,284, the contents of which are incorporated entirely herein by reference. Because a high electron mobility transistor is based upon the use of a heterostructure, such transistors are also referred to as heterostructure field effect transistors (HFETs).

In this embodiment, the transistor 35 includes a layer of gallium nitride 36 which in many circumstances is supported by a substrate 37, typically formed of silicon carbide or sapphire. In either case a buffer layer 40, typically of aluminum gallium nitride, is used to provide an appropriate transition between the substrate 37 and the gallium nitride layer 36 given the differences in the unit cell dimensions between and among these materials.

The aluminum gallium nitride layer 41 is on the gallium nitride layer 36 and has a wider bandgap than gallium nitride. As set forth in the background, the bandgap of gallium nitride at room temperature is about 3.4 eV while that of aluminum nitride is 6.2 eV. Accordingly, the bandgap of the layer 41 will depend upon the atomic fraction (x) of aluminum and gallium in the composition $Al_xGa_{1-x}N$.

As is generally well understood in the art, the wider bandgap AlGaN layer 41 separates a gate electrode 42 from the gallium nitride layer 36. Above the threshold voltage, a two-dimensional electron gas (2DEG) schematically indicated by the thin layer 43 is formed at the heterointerface between the wider bandgap AlGaN layer and the narrower bandgap GaN layer (or channel) 36. The two-dimensional electron gas carries the drain-source current. The high mobility of the electron gas provides the capacity for the devices to operate at higher frequencies than more conventional transistors.

FIGS. 3 and 4 also illustrates respective source 44 and drain contacts 45 and a passivation or insulating layer 46 typically formed of silicon dioxide, silicon nitride, or favorable combinations of silicon dioxide and silicon nitride. Exemplary, but not limiting passivation layers are disclosed in commonly assigned U.S. Pat. No. 5,766,837 or 6,246,076, the contents of which are incorporated entirely herein by reference.

A metal interconnect structure 47 is made to at least one, two, or all of the source contact 44, the drain contact 45, or the gate contact 42. As in the previous embodiments, the interconnect structure includes at least two diffusion barrier layers (and potentially more than two) alternating with at least two respective high electrical conductivity layers. The diffusion barrier layers have a coefficient of thermal expansion different from and lower than the coefficient of thermal expansion of the high electrical conductivity layers, and the differences in the respective coefficients of thermal expansions are large enough to constrain the expansion of the high conductivity layers but is less than the difference that would create a strain between adjacent layers that would exceed the bond strength between the layers. As in the previous embodiments, the interconnect structure 47 can include an adhesive layer adjacent at least one of the diffusion barrier layers.

In a transistors such as illustrated at 35 in FIGS. 3 and 4, the gallium nitride layer 36 can be semi-insulating which will typically mean that it has a resistivity of at least about 5000 ohm centimeters, and potentially more.

Devices formed according to the present invention have been operated at 10 watts per millimeter (based on a nominal design of four watts per millimeter) for several hundred hours without failure.

Figure 5:
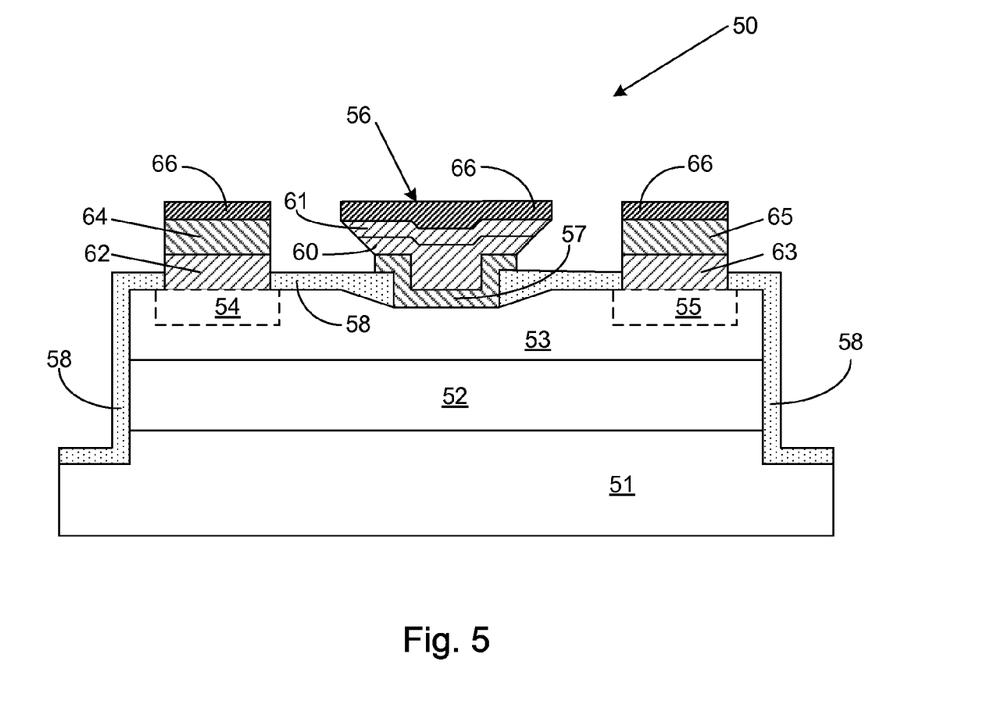
FIG. 5 is a cross-sectional schematic diagram of a metal interconnect system according to the invention in the context of an metal-semiconductor field effect transistor.

FIG. 5 is a cross sectional diagram of a metal-semiconductor field effect transistor (MESFET) broadly designated at 50 that illustrates aspects of the present invention. The illustrated MESFET generally corresponds to those described in commonly assigned U.S. Pat. No. 6,686,616, the contents of which are incorporated entirely herein by reference. It will nevertheless be understood that the illustrated MESFET is exemplary, rather than limiting, of MESFET structures and of the invention.

The n-type 50 includes a silicon carbide substrate 51 which is typically (although not exclusively) semi-insulating. In the illustrated diode, a wide bandgap p-type epitaxial layer 52 is on the substrate 51 and a wide bandgap n-type epitaxial layer 53 is on the p-type layer 52. The n-type epitaxial layer 53 optionally includes more heavily doped wells 54 and 55. A gate contact structure broadly designated at 56 is on the n-type epitaxial layer 53. The gate contact 56 (which in a MESFET is a Schottky contact) can be formed of several layers of metal. In the illustrated embodiment these layers can include, for example, a first gate layer 57 formed of a metal such as chromium that has the desired Schottky characteristics, a barrier layer 60 of an appropriate metal such as platinum and a highly conductive layer 61 formed of a metal such as gold. The source and the drain include the ohmic contacts 62 and 63 respectively and are typically formed of nickel or nickel silicide. The ohmic contacts 62 and 63 are also typically include a metal overlayer 64 and 65 respectively which typically include layers of titanium, platinum, and gold.

A passivation layer 58 is typically included and can be formed by the method described in commonly assigned U.S. Pat. No. 5,972,801, the contents of which are incorporated entirely herein by reference.

The metallization structure according to the invention can then be used to contact any one or more of the source, gate or drain. FIG. 5 illustrates the metallization structure at 66 with portions on each of the source, the gate, and the drain.

Although the invention has been described with respect to high-power transistors, it can offer advantages in any electronic device that dissipates a high power density or that operates under cyclical thermal stresses, or a combination of high power density and thermal stress. Thus, in addition to microwave and power transistors, the invention can be incorporated with optoelectronic devices, passive electronic and electromechanical devices, and photonic devices. In addition to long-pulse radar systems, the invention offers particular advantages in switching power supplies, electronic warfare systems, microwave communication systems, traditional and alternative energy power generation, and electric vehicle propulsion systems.

In the drawings and specification there has been set forth a preferred embodiment of the invention, and although specific terms have been employed, they are used in a generic and descriptive sense only and not for purposes of limitation, the scope of the invention being defined in the claims.

The invention claimed is:

1. A semiconductor device structure comprising:
a wide-bandgap semiconductor portion selected from the group consisting of silicon carbide and Group III nitrides;
an interconnect structure to said wide-bandgap semiconductor portion, said interconnect structure comprising a plurality of diffusion barrier layers alternating with a plurality of high electrical conductivity layers, the plurality of diffusion barrier layers and the plurality of high electrical conductivity layers comprising:
a first diffusion barrier layer on a surface of a portion of the semiconductor device structure selected from the group consisting of said wide-bandgap semiconductor portion, an ohmic contact, a Schottky contact, and a dielectric layer;
a first high electrical conductivity layer on a surface of the first diffusion barrier layer opposite the portion of the semiconductor device structure;
a second diffusion barrier layer on a surface of the first high electrical conductivity layer opposite the first diffusion barrier layer;
a second high electrical conductivity layer on a surface of the second diffusion barrier layer opposite the first high electrical conductivity layer;
a third diffusion barrier layer on a surface of the second high electrical conductivity layer opposite the second diffusion layer;
a first adhesion layer, wherein the first diffusion barrier layer is directly on the first adhesion layer;
said plurality of diffusion barrier layers having a coefficient of thermal expansion different from and lower than a coefficient of thermal expansion of said plurality of high electrical conductivity layers; and
the difference in the respective coefficients of thermal expansions being large enough to constrain the expansion of said plurality of high electrical conductivity layers but less than a difference that would create a strain between adjacent diffusion and high electrical conductivity layers that would exceed a bond strength between the adjacent diffusion and high electrical conductivity layers.

2. A semiconductor device structure according to claim 1 wherein:
said plurality of high electrical conductivity layers are selected from the group consisting of gold and aluminum; and
said plurality of diffusion barrier layers are selected from the group consisting of platinum, chrome, nickel and alloys thereof.

3. A semiconductor device structure according to claim 1 wherein said first adhesion layer is selected from the group consisting of titanium, chrome, tungsten and molybdenum.

4. A semiconductor device structure according to claim 1 wherein:
the coefficient of thermal expansion of said plurality of high electrical conductivity layers is greater than the coefficient of thermal expansion of said plurality of diffusion barrier layers by a factor of between about 1.5 and 2; and
said interconnect structure has a thickness of between about 0.1 and 10 microns.

5. A semiconductor device structure according to claim 1 further comprising:
an ohmic contact to said wide-bandgap semiconductor portion with said interconnect structure being on said ohmic contact.

6. A semiconductor device structure according to claim 1 selected from the group consisting of junction diodes, insulated gate field effect transistors, metal semiconductor field effect transistors and high electron mobility transistors.

7. A semiconductor device structure according to claim 1 wherein said plurality of diffusion barrier layers are identical in composition to one another and said plurality of high electrical conductivity layers are identical in composition to one another.

8. A semiconductor device structure according to claim 1 wherein said plurality of diffusion barrier layers are different from one another in composition and said plurality of high electrical conductivity layers have different compositions from one another.

9. A semiconductor device structure according to claim 1 further comprising:
a second adhesion layer directly on the third diffusion barrier layer, wherein the adhesion layers are separate and distinct from the diffusion barrier layers.

10. A wide bandgap insulated gate field effect transistor (IGFET) comprising:
a first semiconductor portion selected from the group consisting of silicon carbide and the Group III nitrides, said semiconductor portion having a first conductivity type;
respective source and drain portions in said first semiconductor portion having the opposite conductivity type from said first semiconductor portion;
a gate insulator on said first semiconductor portion between said source and drain portions;
a gate contact on said gate insulator; and
an interconnect structure on at least one of said source, said gate contact, and said drain;
said interconnect structure comprising a plurality of diffusion barrier layers alternating with a plurality of high electrical conductivity layers, the plurality of diffusion barrier layers and the plurality of high electrical conductivity layers comprising:
a first diffusion barrier layer on a surface of a portion of the semiconductor device structure selected from the group consisting of said wide-bandgap semiconductor portion, an ohmic contact, a Schottky contact, and a dielectric layer;
a first high electrical conductivity layer on a surface of the first diffusion barrier layer opposite the portion of the semiconductor device structure;
a second diffusion barrier layer on a surface of the first high electrical conductivity layer opposite the first diffusion barrier layer;
a second high electrical conductivity layer on a surface of the second diffusion barrier layer opposite the first high electrical conductivity layer;
a third diffusion barrier layer on a surface of the second high electrical conductivity layer opposite the second diffusion layer;
a first adhesion layer, wherein the first diffusion barrier layer is directly on the first adhesion layer;
said plurality of diffusion barrier layers having a coefficient of thermal expansion different from and lower than a coefficient of thermal expansion of said plurality of high electrical conductivity layers; and
the difference in the respective coefficients of thermal expansions being large enough to constrain the expansion of said plurality of high conductivity layers but less than a difference that would create a strain between adjacent diffusion and high electrical conductivity layers that would exceed a bond strength between the adjacent diffusion and high electrical conductivity layers.

11. An IGFET according to claim 10 wherein:
said semiconductor portions comprise silicon carbide;
said diffusion barrier layers comprise platinum; and
said high conductivity layers comprise gold.

12. An IGFET according to claim 10 further comprising:
respective ohmic contacts on said source and said drain with said interconnect on at least one of said ohmic contacts.

13. An IGFET according to claim 10 wherein the first adhesion layer is selected from the group consisting of titanium, tungsten and molybdenum.

14. An IGFET structure according to claim 10 wherein:
said high electrical conductivity layers are selected from the group consisting of gold and aluminum; and
said diffusion barrier layers are selected from the group consisting of platinum, chrome and alloys thereof.

15. An IGFET according to claim 10 wherein:
the coefficient of thermal expansion of said high electrical conductivity layers is greater than the coefficient of thermal expansion of said diffusion barrier layers by a factor of between about 1.5 and 2; and
said interconnect structure has a thickness of between about 0.1 and 10 microns.

16. A high electron mobility transistor comprising:
a layer of gallium nitride;
a layer of aluminum gallium nitride on said layer of gallium nitride and forming a heterojunction between said layer of gallium nitride and said layer of aluminum gallium nitride;
respective source and drain contacts to said layer of gallium nitride;
a gate contact to said layer of aluminum gallium nitride;
a metal interconnect structure to at least one of said source contact, said drain contact, and said gate contact;
said metal interconnect structure comprising a plurality of diffusion barrier layers alternating with a plurality of high electrical conductivity layers, the plurality of diffusion barrier layers and the plurality of high electrical conductivity layers comprising:
a first diffusion barrier layer on a surface of said at least one of said source contact, said drain contact, and said gate contact;
a first high electrical conductivity layer on a surface of the first diffusion barrier layer opposite said at least one of said source contact, said drain contact, and said gate contact;
a second diffusion barrier layer on a surface of the first high electrical conductivity layer opposite the first diffusion barrier layer;
a second high electrical conductivity layer on a surface of the second diffusion barrier layer opposite the first high electrical conductivity layer; and
a third diffusion barrier layer on a surface of the second high electrical conductivity layer opposite the second diffusion layer;
a first adhesion layer, wherein the first diffusion barrier layer is directly on the first adhesion layer;
said plurality of diffusion barrier layers having a coefficient of thermal expansion different from and lower than a coefficient of thermal expansion of said plurality of high electrical conductivity layers; and
the difference in the respective coefficients of thermal expansions being large enough to constrain the expansion of said plurality of high electrical conductivity layers but less than a difference that would create a strain between adjacent diffusion and high electrical conductivity layers that would exceed a bond strength between the adjacent diffusion and high electrical conductivity layers.

17. A high electron mobility transistor according to claim 16 further comprising:
a substrate selected from the group consisting of silicon carbide and sapphire; and
a Group III nitride buffer layer on said substrate; where said substrate and said Group III nitride buffer layer support said layer of gallium nitride.

18. A high electron mobility transistor according to claim 17 wherein said Group III nitride buffer layer comprises aluminum gallium nitride and said layer of gallium nitride has a resistivity of at least 5000 ohm-cm.

19. A high electron mobility transistor according to claim 16 wherein said metal interconnect structure is to at least two of said source contact, said drain contact, and said gate contact.

20. A high electron mobility transistor according to claim 16 wherein the first adhesion layer is selected from the group consisting of titanium, tungsten and molybdenum.

21. A high electron mobility transistor according to claim 16 wherein:
said plurality of high electrical conductivity layers are selected from the group consisting of gold and aluminum; and
said plurality of diffusion barrier layers are selected from the group consisting of platinum, chrome and alloys thereof.

22. A high electron mobility transistor according to claim 16 wherein:
the coefficient of thermal expansion of said plurality of high electrical conductivity layers is greater than the coefficient of thermal expansion of said plurality of diffusion barrier layers by a factor of between about 1.5 and 2; and
said metal interconnect structure has a thickness of between about 0.1 and 10 microns.

23. A high electron mobility transistor according to claim 16 wherein said plurality of diffusion barrier layers are identical in composition to one another and said plurality of high electrical conductivity layers are identical in composition to one another.

24. A high electron mobility transistor according to claim 16 wherein said plurality of diffusion barrier layers are different from one another in composition and said plurality of high electrical conductivity layers have different compositions from one another.

* * * * *